United States Patent
Grabbe et al.

(10) Patent No.: US 8,796,116 B2
(45) Date of Patent: Aug. 5, 2014

(54) METHODS FOR REDUCING THE METAL CONTENT IN THE DEVICE LAYER OF SOI STRUCTURES AND SOI STRUCTURES PRODUCED BY SUCH METHODS

(75) Inventors: Alexis Grabbe, St. Charles, MO (US); Larry Flannery, Warrenton, MO (US)

(73) Assignee: SunEdison Semiconductor Limited, Singapore (SG)

( * ) Notice: Subject to any disclaimer, the term of this patent is extended or adjusted under 35 U.S.C. 154(b) by 0 days.

(21) Appl. No.: 13/354,788

(22) Filed: Jan. 20, 2012

(65) Prior Publication Data

US 2012/0193753 A1    Aug. 2, 2012

Related U.S. Application Data

(60) Provisional application No. 61/437,993, filed on Jan. 31, 2011.

(51) Int. Cl.
*H01L 21/322* (2006.01)

(52) U.S. Cl.
CPC ......... *H01L 21/3226* (2013.01); *H01L 21/3221* (2013.01)
USPC ............ 438/471; 438/476; 438/473; 257/506

(58) Field of Classification Search
CPC .................................. H01L 21/3221–21/3226
USPC .................................. 438/471–477; 257/288
See application file for complete search history.

(56) References Cited

U.S. PATENT DOCUMENTS

| | | | |
|---|---|---|---|
| 4,824,698 A * | 4/1989 | Jastrzebski et al. | 438/476 |
| 5,189,500 A | 2/1993 | Kusunoki | |
| 5,436,175 A | 7/1995 | Nakato et al. | |
| 5,478,758 A | 12/1995 | Easter | |
| 6,077,731 A | 6/2000 | Yamazaki et al. | |
| 6,225,152 B1 | 5/2001 | Yamazaki et al. | |
| 6,790,747 B2 | 9/2004 | Henley et al. | |
| 7,256,104 B2 | 8/2007 | Ito et al. | |
| 2004/0097055 A1 * | 5/2004 | Henley et al. | 438/471 |
| 2005/0037596 A1 | 2/2005 | Erokhin et al. | |
| 2005/0250297 A1 * | 11/2005 | Shive et al. | 438/471 |
| 2009/0273010 A1 * | 11/2009 | Simoen et al. | 257/288 |

OTHER PUBLICATIONS

Istratov et al., Intrinsic Diffusion Coefficient of Interstitial Copper in Silicon, 1998, Physical Review Letters, vol. 81, No. 6, 1243-1246.*
Istratov et al., Nickel solubility in intrinsic and doped silicon, 2005, Journal of Applied Physics, 97, 023505.*
Yoshida et al., Behavior of Nickel as an Impurity in Silicon, 1964, Japanese Journal of Applied Physics, vol. 3, No. 9, 521-529.*
Falster, Gettering in silicon: fundamentals and recent advances, 2001, Semiconductor Fabtech, 13th edition, 1-14.*
R.S. Wagner and W.C. Ellis, Vapor-Liquid-Solid Mechanism of Single Crystal Growth, Applied Physics Letters, Mar. 1, 1964, pp. 89-90, vol. 4, No. 5, Bell Telephone Laboratories, Inc., New Jersey.

(Continued)

*Primary Examiner* — Julia Slutsker
*Assistant Examiner* — Natalia Gondarenko
(74) *Attorney, Agent, or Firm* — Armstrong Teasdale LLP (57) ABSTRACT

Methods for producing silicon on insulator structures with a reduced metal content in the device layer thereof are disclosed. Silicon on insulator structures with a reduced metal content are also disclosed.

23 Claims, 7 Drawing Sheets

(56) References Cited

OTHER PUBLICATIONS

E.R. Weber, Diffusion of Ni in Si, INSPEC, EMIS Datareview RN=17858, pp. 424-425, 1987, No. 4.
E.R. Weber, Solubility of Ni in Si, INSPEC, EMIS Datareview RN=17859, pp. 446-447, 1987, No. 4.
Jun-Ichiro Furihata, et al., Heavy-Metal (Fe/Ni/Cu) Behavior in Ultrathin Bonded Silicon-On-Insulator (SOI) Wafers Evaluated Using Radioactive Isotope Tracers, Jpn. J. Appl. Phys., 2009, pp. 2251-2255, vol. 39, The Japan Society of Applied Physics.
PCT International Search Report and Written Opinion of the International Searching Authority mailed on Aug. 27, 2012 regarding PCT/US2012/022970; 12 pages.
Non-Final Office Action, U.S. Appl. No. 13/762,974, dated May 8, 2013, pp. 14.
Non-Final Office Action, U.S. Appl. No. 13/762,967, dated May 21, 2013, pp. 14.

* cited by examiner

METHODS FOR REDUCING THE METAL CONTENT IN THE DEVICE LAYER OF SOI STRUCTURES AND SOI STRUCTURES PRODUCED BY SUCH METHODS

CROSS-REFERENCE TO RELATED APPLICATION

The present application claims the benefit of U.S. Provisional Patent Application No. 61/437,993, filed Jan. 31, 2011, which is incorporated herein by reference.

FIELD OF THE DISCLOSURE

The field of the present disclosure relates to methods for producing silicon on insulator structures and, in particular, methods for producing silicon on insulator structures with a reduced metal content in the device layer thereof. The present disclosure also relates to silicon on insulator structures produced by such methods.

BACKGROUND

Silicon on insulator structures ("SOI structures" which may also be referred to herein as "SOI wafers" or "SOI substrates") generally include a handle wafer, a silicon layer (also characterized as a "device layer"), and a dielectric layer (such as an oxide layer) between the handle wafer and the silicon layer. Transistors built within the top silicon layer of SOI structures switch signals quickly compared to transistors built on bulk silicon wafers, run at lower voltages and are much less vulnerable to signal noise from background cosmic ray particles. Each transistor is isolated from its neighbor by a complete layer of silicon dioxide. These transistors are generally immune to "latch-up" problems and can be spaced closer together than transistors built on bulk silicon wafers. Building circuits on SOI structures increases productivity by allowing for more compact circuit designs, yielding more chips per wafer.

Metal contamination in semiconductor wafers is detrimental as the contamination can cause yield losses in the resulting integrated circuits. Metal contamination has increasingly become a concern in view of the trend toward smaller devices, devices with faster operational speeds and lower manufacturing costs. Metal contamination may be introduced into semiconductor wafers in a number of processing steps including wafer polishing, cleaning, bond strength enhancing thermal treatment, epitaxy, oxide stripping, plasma activation, wet chemical etching, gas phase chemical etching, high temperature annealing, ion implantation, oxidation and the like. SOI wafers made by layer transfer are sensitive to metal contamination as the device layer is thin and three surfaces must be cleaned. Surface contamination can diffuse into the thin device layer at a higher concentration relatively to thicker bulk wafers.

A continuing need exists for semiconductor wafers with a reduced metal content and, in particular, silicon on insulator structures with a reduced metal content in the device layer thereof. A continuing need also exists for methods for producing such wafers.

SUMMARY

One aspect of the present disclosure is directed to a method for reducing the metal content of a silicon on insulator structure. The silicon on insulator structure includes a handle wafer, a silicon device layer having a front surface and a dielectric layer between the handle wafer and the silicon layer. The dielectric layer and silicon device layer form an interface between the dielectric layer and silicon device layer. A sacrificial oxide layer is formed on the front surface of the silicon device layer. The sacrificial oxide layer and the silicon device layer form an interface between the sacrificial oxide layer and the silicon device layer. The silicon on insulator structure having a sacrificial oxide layer thereon is heated to a temperature $T_1$ sufficient to dissolve all metal precipitates present in the device layer for a time $t_1$ sufficient to allow metal atoms to evenly disperse throughout the device layer. The temperature $T_1$ is less than a temperature at which the metal atoms cross the sacrificial oxide layer-silicon device layer interface and enter the sacrificial oxide layer. The silicon on insulator structure is cooled from $T_1$ to a temperature $T_2$ at which the metal atoms are substantially immobile in silicon at an average cooling rate of R to cause metal atoms to dissolve to the sacrificial oxide layer-silicon device layer interface and the silicon device layer-dielectric layer interface. The cooling rate is sufficiently high enough to cause substantially no metal precipitation to occur in the silicon device layer during cooling. The sacrificial oxide layer and a portion of the metal atoms at the sacrificial oxide layer-silicon device layer interface are removed from the silicon-in-insulator structure.

A further aspect of the present disclosure is directed to a silicon on insulator structure having a handle wafer, a silicon device layer, a dielectric layer between the handle wafer and the silicon device layer, and a sacrificial oxide layer. The silicon device layer is bonded to the dielectric layer at a first surface and is bonded to the sacrificial oxide layer at a second surface which forms a sacrificial oxide-silicon device layer interface. The device layer includes metal atoms of a first type and at least about 50% of the metal atoms of the first type are positioned in the device layer at the interface.

Another aspect of the present disclosure is directed to a silicon on insulator structure having a handle wafer, a silicon device layer having a front surface, and a dielectric layer between the handle wafer and the silicon device layer. The dielectric layer and silicon device layer form an interface between the dielectric layer and silicon device layer. The silicon on insulator structure has the amount of metal in the device layer reduced by forming a sacrificial oxide layer on the front surface of the silicon device layer thereby forming an interface between the sacrificial oxide layer and the silicon device layer. The silicon on insulator structure having a sacrificial oxide layer thereon is heated to a temperature $T_1$ sufficient to dissolve all metal precipitates present in the device layer for a time $t_1$ sufficient to allow metal atoms to evenly disperse throughout the device layer. The temperature $T_1$ is less than a temperature at which the metal atoms cross the sacrificial oxide layer-silicon device layer interface and enter the sacrificial oxide layer. The silicon on insulator structure is cooled from $T_1$ to a temperature $T_2$ at which the metal atoms are substantially immobile in silicon at an average cooling rate of R to cause metal atoms to dissolve to the sacrificial oxide layer-silicon device layer interface and the silicon device layer-dielectric layer interface. The cooling rate is sufficiently high enough to cause substantially no metal precipitation to occur in the silicon device layer during cooling. The sacrificial oxide layer and a portion of the metal atoms at the sacrificial oxide layer-silicon device layer interface are removed from the silicon-in-insulator structure. The silicon device layer includes metal of a first type in an amount at or below the solubility limit of the metal in silicon at temperature $T_1$ after the amount of metal in the device layer has been reduced.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 6:
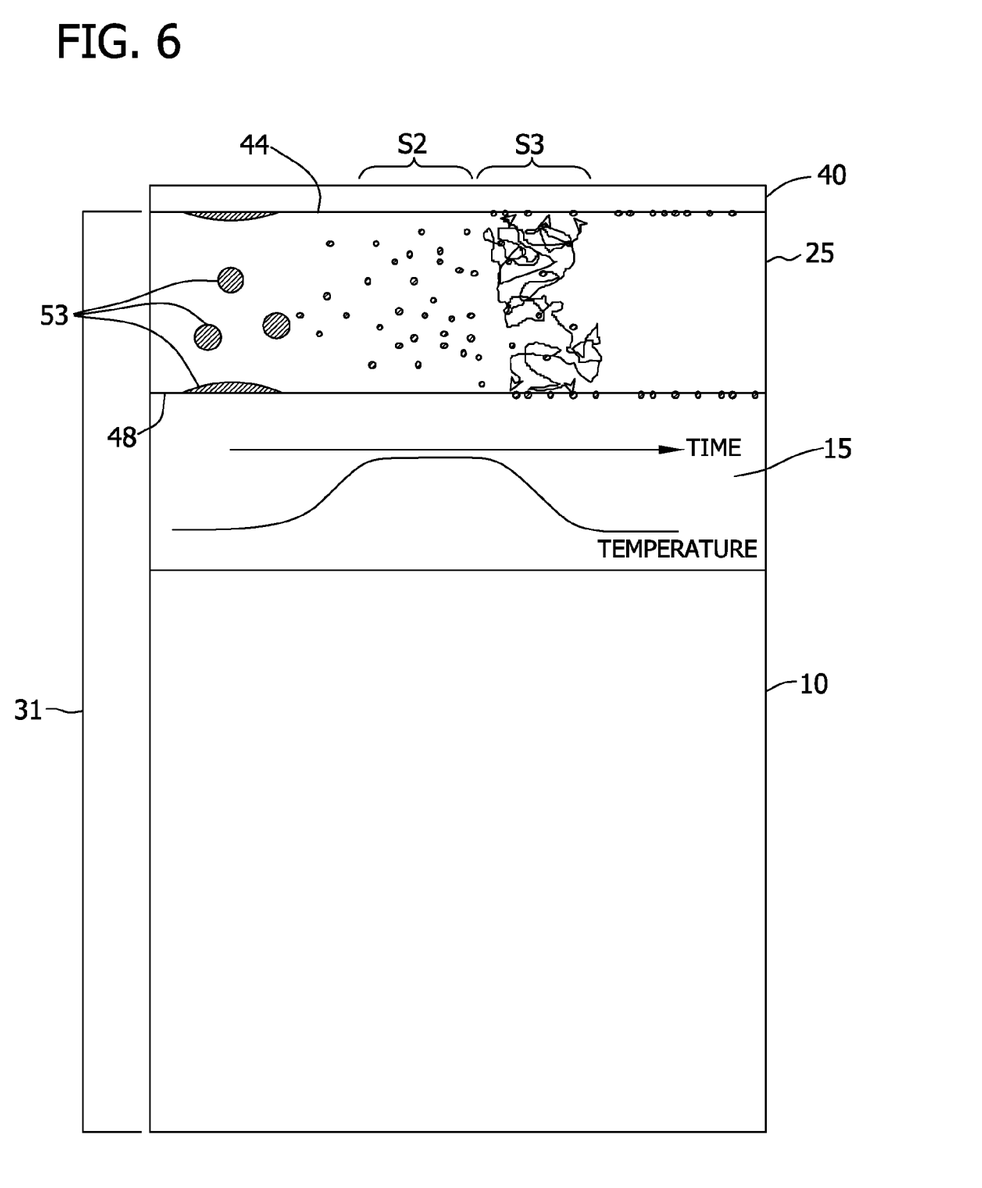
FIG. 6 is a schematic view of a SOI structure which shows migration of metal atoms in the silicon device layer.

In accordance with the present disclosure, the metal content in the device layer of a silicon on insulator structure may be reduced by forming a sacrificial oxide layer on the surface of the silicon on insulator structure in a first step $S_1$. As schematically shown in FIG. 6, the structure is heated to a temperature at which a particular metal contaminant (e.g., nickel precipitates) dissolves for a sufficient amount of time to allow the metal atoms to evenly disperse throughout the device layer in step $S_2$. The cooling rate of the SOI structure is controlled in step $S_3$ to allow the metal atoms to migrate to and become "pinned" at the interface between the sacrificial oxide layer and the device layer. The sacrificial oxide layer and metal atoms at the interface therewith are removed by etching in step $S_4$ to reduce the concentration of contaminants in the device layer. The process may be repeated in one or more additional cycles to further reduce the concentration of metal in the device layer.

Multi-layered structures and, in particular, silicon on insulator structures and methods for producing silicon on insulator structures are generally known by those skilled in the art (see, for example, U.S. Pat. Nos. 5,189,500; 5,436,175 and 6,790,747, each of which is incorporated herein by reference for all relevant and consistent purposes). In an exemplary process for making a multi-layered structure, two separate structures are prepared, bonded together along a bond interface, and then delaminated (i.e., cleaved) along a separation plane that is different from the bond interface and which has been formed via an implantation technique. One structure is typically referred to as the "handle" wafer (or structure) and the other is typically referred to as the "donor" wafer (or structure).

A dielectric layer may be deposited on the surface of the donor wafer, the handle wafer or both, prior to bonding the donor and handle together. In this regard, the SOI structures and methods for preparing the SOI structures are described herein as having a dielectric layer deposited or grown on the donor wafer and as having the surface of the handle wafer bonded to the surface of the dielectric layer. However, it should be understood that the dielectric layer may be grown or deposited on the handle wafer alternatively or in addition to growing or depositing the dielectric layer on the donor wafer and that these structures may be bonded in any of the various arrangements without limitation. Reference herein to the dielectric layer being disposed on the handle wafer alone should not be considered in a limiting sense.

Typically, at least the donor wafer and more typically both the donor wafer and the handle wafer are composed of single crystal silicon wafers, however it should be noted that other starting structures may be used such as multi-layered and/or heterolayered structures without departing from the present disclosure.

The handle wafer may be obtained from any material common in the art for preparing multi-layered structures, such as silicon, germanium, gallium arsenide, silicon germanium, gallium nitride, aluminum nitride, phosphorous, quartz, sapphire and combinations thereof Similarly, the donor wafer may contain silicon, germanium, gallium arsenide, silicon germanium, gallium nitride, aluminum nitride, phosphorous, quartz, sapphire and combinations thereof Typically however, the handle wafers and donor wafers used according to the methods of the present disclosure are single crystal silicon wafers and generally are single crystal silicon wafers which have been sliced from a single crystal ingot grown in accordance with conventional Czochralski crystal growing methods. As such, the following discussion frequently refers to a specific type of multi-layered structure, i.e., SOI structures, for illustrative purposes. In this regard, it should be noted that the handle wafer and/or the donor wafer used in accordance with the present disclosure may be any diameter suitable for use by those of skill in the art including, for example, 200 mm, 300 mm, greater than 300 mm or even 450 mm diameter wafers.

Figure 1:
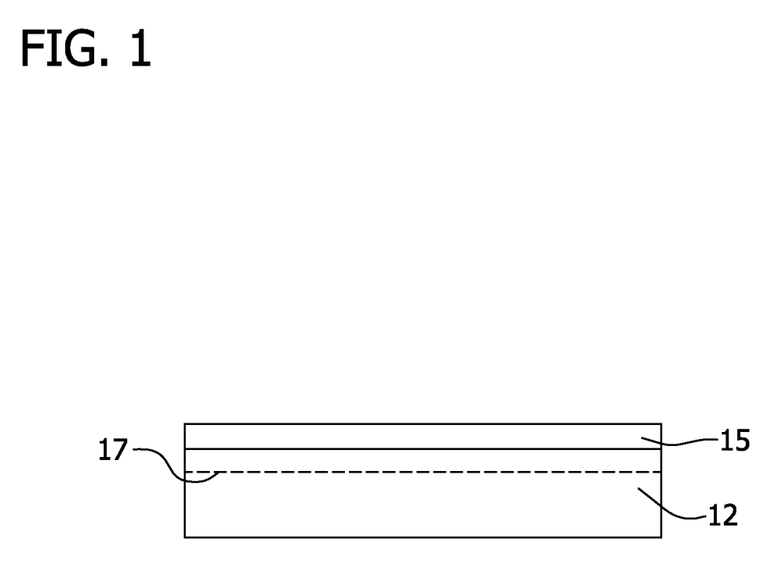
FIG. 1 is cross-section view of a donor wafer with a dielectric layer disposed thereon.

Referring to FIG. 1, a dielectric layer 15 (e.g., a silicon oxide and/or silicon nitride layer) is deposited on a polished front surface of a donor wafer 12. The dielectric layer 15 may be applied according to any known technique in the art, such as thermal oxidation, wet oxidation, chemical vapor deposition, thermal nitridation or a combination of these techniques. Generally speaking, the dielectric layer 15 is grown to a substantially uniform thickness sufficient to provide the desired insulating properties in the final structure. Typically, however, the dielectric layer has a thickness of at least about 1 nm and less than about 10,000 nm, less than about 5,000 nm, less than about 1,000 nm, less than about 500 nm, less than about 150 nm, less than about 100 nm or even less than about 50 nm. The dielectric layer 15 may be any electrically insulating material suitable for use in a SOI structure, such as a material comprising $SiO_2$, $Si_3N_4$, aluminum oxide, or magnesium oxide. In some embodiments, the dielectric layer 15 is $SiO_2$ (i.e., the dielectric layer consists essentially of $SiO_2$ with impurities being present therein). However, it is to be noted that in some instances, it may alternatively be preferable to use a material for the dielectric layer which has a melting point which is higher than the melting point of pure $SiO_2$ (i.e., higher than about 1700° C.). Examples of such materials are silicon nitride ($Si_3N_4$), aluminum oxide, and magnesium oxide.

Ions (e.g., hydrogen atoms, helium atoms or a combination of hydrogen and helium atoms) are implanted at a substantially uniform specified depth beneath the front surface of the donor wafer to define a cleave plane 17. It should be noted, that when combinations of ions are implanted, they may be implanted concurrently or sequentially. Ion implantation may be achieved using means known in the art. For example, this implantation may be achieved in a manner similar to the process disclosed in U.S. Pat. No. 6,790,747. Implantation parameters may include, for example, implantation of ions to a total dose of about $1 \times 10^{15}$ to about $5 \times 10^{16}$ ions/cm$^2$ at a total energy of, for example, about 20 to about 125 keV (e.g., $H_2^+$ may be implanted at an energy of 20 keV and a dose of $2.4 \times 10^{16}$ ions/cm$^2$). When a combination of ions is used, the dose may be adjusted between the combination of ions accordingly (e.g., $He^+$ may be implanted at an energy of 36 keV and a dose of $1 \times 10^{16}$ ions/cm$^2$ followed by $H_2^+$ implanted at an energy of 48 keV and a dose of $5 \times 10^{15}$ ions/cm$^2$).

When implantation is performed prior to deposition of the dielectric layer, the subsequent growth or deposition of the dielectric layer on the donor wafer is suitably performed at a temperature low enough to prevent premature separation or cleaving along plane 17 in the donor layer (i.e., prior to the wafer bonding process step). The separation or cleaving temperature is a complex function of the implanted species, implanted dose and implanted material. However, typically, premature separation or cleaving may be avoided by maintaining a deposition or growth temperature below about 500° C.

Figure 2:
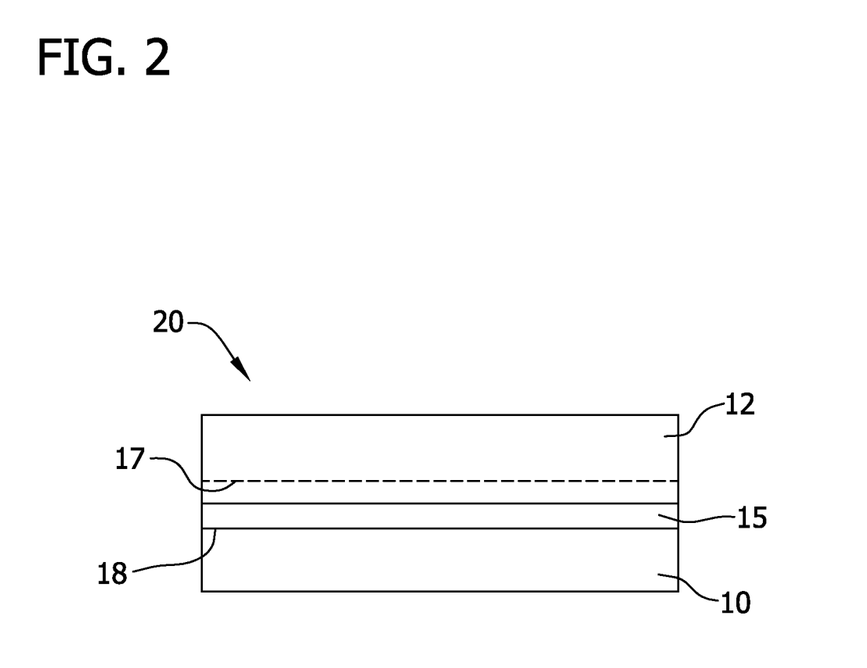
FIG. 2 is a cross-section view of the donor wafer and dielectric layer bonded to a handle wafer.

Referring now to FIG. 2, the front surface of the dielectric layer 15 is then bonded to the front surface of a handle wafer 10 to form a bonded wafer 20 through a hydrophilic bonding process. The dielectric layer 15 and handle wafer 10 may be bonded together by exposing the surfaces of the wafers to a plasma containing, for example, oxygen or nitrogen. Exposure to the plasma modifies the structure of the surfaces in a process often referred to as surface activation. The wafers are then pressed together and a bond at the bond interface 18 is formed there between.

Prior to bonding, the surfaces of the dielectric layer and handle wafer may optionally undergo cleaning and/or a brief etching, planarization, or plasma activation to prepare their surfaces for bonding using techniques known in the art. Without being held to a particular theory, it is generally believed that the quality of the silicon surface of the SOI structure is, in part, a function of the quality of the surface prior to bonding. Additionally, the quality of both surfaces prior to bonding will have a direct impact on the quality or strength of the resulting bond interface.

In some instances, therefore, the dielectric layer and/or handle wafer may be subjected to one or more of the following procedures in order to obtain, for example, a low surface roughness (e.g., a roughness of less than about 0.5 nm root mean square (RMS)) prior to bonding: (i) planarization by, for example, CMP and/or (ii) cleaning by, for example, a wet chemical cleaning procedure, such as a hydrophilic surface preparation process (e.g., an RCA SC-1 clean process wherein the surfaces are contacted with a solution containing ammonium hydroxide, hydrogen peroxide, and water at a ratio of, for example, 1:2:50 at about 65° C. for about 20 minutes, followed by a deionized water rinse and drying). One or both of the surfaces may also optionally be subjected to a plasma activation after, or instead of, the wet cleaning process to increase the resulting bond strength. The plasma environment may include, for example, oxygen, ammonia, argon, nitrogen, diborane or phosphine.

Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer). Typically, however, wafer bonding is achieved by contacting the surface of the dielectric layer and the handle wafer at a reduced pressure (e.g., about 50 mTorr) and at room temperature, followed by heating at an elevated temperature (e.g., at least about 200° C., at least about 300° C., at least about 400° C., or even at least about 500° C.) for a sufficient period of time (e.g., at least about 10 seconds, at least about 1 minute, at least about 15 minutes, at least about 1 hour or even at least about 3 hours). For example, the heating may take place at about 350° C. for about 1 hour. The resulting interface may have a bond strength that is greater than about 500 mJ/m$^2$, greater than about 1000 mJ/m$^2$, greater than about 1500 mJ/m$^2$, or even greater than about 2000 mJ/m$^2$. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the ions earlier implanted in the donor wafer weaken the cleave plane. A portion of the donor wafer is then separated (i.e., cleaved) along the cleave plane from the bonded wafer to form the SOI structure.

Figure 3:
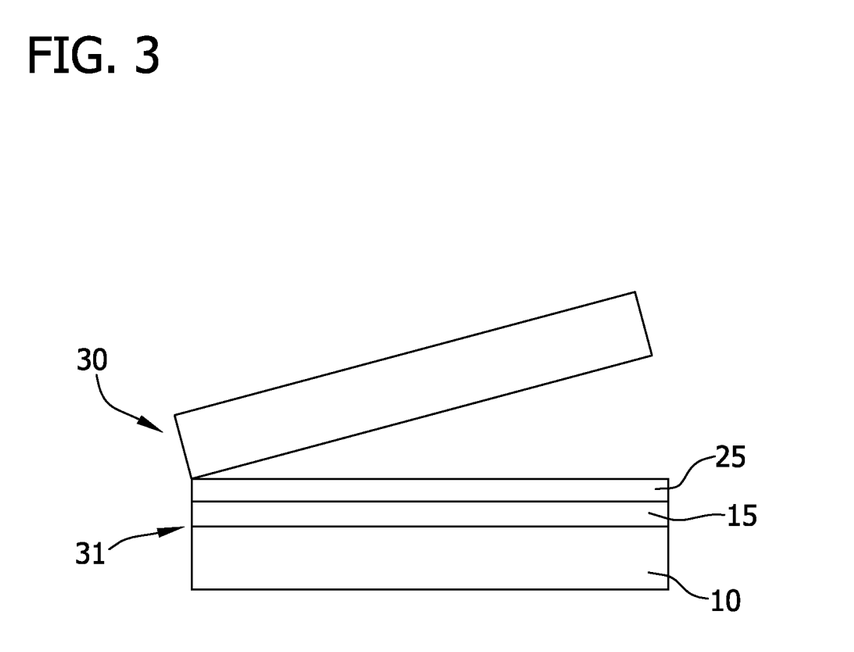
FIG. 3 is a cross-section view of the SOI structure upon cleaving the donor wafer at the cleave plane.

After the bond interface has been formed, the resulting bonded structure is subjected to conditions sufficient to induce a fracture along the separation or cleave plane within the donor wafer (FIG. 3). Generally speaking, this fracture may be achieved using techniques known in the art, such as thermally and/or mechanically induced cleaving techniques. Typically, however, fracturing is achieved by annealing the bonded structure at a temperature of at least about 200° C., at least about 300° C., at least about 400° C., at least about 500° C., at least about 600° C., at least about 700° C. or even at least about 800° C. (the temperature being in the range of, for example, about 200° C. to about 800° C., or from about 250° C. to about 650° C.) for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions.

In this regard it is to be noted that in an alternative embodiment, this separation may be induced or achieved by means of mechanical force, either alone or in addition to annealing. For instance, the bonded wafer may be placed in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming a SOI structure.

Referring to FIG. 3, upon separation, two structures 30, 31 are formed. Since the separation of the bonded structure 20 occurs along the cleave plane 17 in the donor wafer 12 (FIG. 2), a portion of the donor wafer remains part of both structures (i.e., a portion of the donor wafer is transferred along with the dielectric layer). Structure 30 comprises a portion of the donor wafer. Structure 31 is the silicon on insulator structure and includes the handle wafer 16, the dielectric layer 15, and a silicon layer 25.

The resulting SOI structure 31 includes a thin layer of silicon 25 (the portion of the donor wafer remaining after cleaving) disposed atop the dielectric layer 15 and the handle wafer 10. The silicon device layer 25 is typically less than about 200 nm thick and the trend toward further miniaturization has led to development of structures with a device layer thickness of less than about 100 nm, less than about 75 nm, less than about 50 nm or even less than about 10 nm (e.g., from about 1 nm to about 200 nm, from about 50 nm to about 200 nm or from about 1 nm to about 10 nm).

The cleave surface of the SOI structure (i.e., the thin layer of silicon of the donor wafer) has a rough surface that may be smoothed by additional processing. The structure 31 may be subjected to additional processing to produce a silicon layer surface having desirable features for device fabrication thereon. Such features include, for example, reduced surface roughness, and/or a reduced concentration of light point defects. To smooth and thin the surface layer of silicon (i.e., cleaved surface), combinations of annealing, chemical-mechanical polishing, high-temperature gaseous etching (i.e., epitaxial-smoothing (epi-smoothing)), or the formation of a sacrificial oxide layer on the cleaved surface may be used. Pre-epitaxial smoothing anneal (PESA) processes that subject the SOI wafer to an elevated temperature (about 1000° C. to about 1200° C.) for several hours may be used. The elevated temperature heals the cleaved surface of the SOI wafer by permitting the crystal structure of the silicon to reorient the dislocations present therein. Alternatively, any of the additionally processing operations (e.g., PESA and/or epi-smoothing) may be performed after the metal reduction process described below.

As described above, the various surfaces of the SOI structure 31 are often cleaned and/or polished during fabrication of the SOI structure to assist in bonding of the various surfaces. For instance, the top surface of the handle wafer 10 and the top surface of the dielectric layer 15 are both cleaned prior to bonding and the surface of the silicon layer 25 is polished and cleaned after cleavage. Each of these cleaning operations introduces metal contaminants into the wafer. The concentration of metal and, in particular, the concentration of nickel which is the principal metal contaminant in the structure (i.e., the concentration in the structure as a whole or "bulk" concentration), may be at least about $1 \times 10^{10}$ atoms/cm$^3$ and in some applications may be at least about $1 \times 10^{11}$ atoms/cm$^3$ or at least about $1 \times 10^{12}$ atoms/cm$^3$. The localized concentration in the silicon device layer 25 may be higher than the bulk concentration and device layer metal concentrations (and in particular the concentration of nickel) of at least about $1 \times 10^{10}$ atoms/cm$^3$, at least about $1 \times 10^{12}$ atoms/cm$^3$ or at least about $1 \times 10^{14}$ atoms/cm$^3$ (e.g., from about $1 \times 10^{10}$ atoms/cm$^3$ to about $1 \times 10^{16}$ atoms/cm$^3$) are typical. Metal contaminants other than nickel may also be present such as, for example, copper and/or cobalt. In this regard, the methods of the present disclosure are particularly well-suited for removing nickel which is more problematic when present in the silicon device layer 25 relative to other metals such as copper and cobalt.

Figure 4:
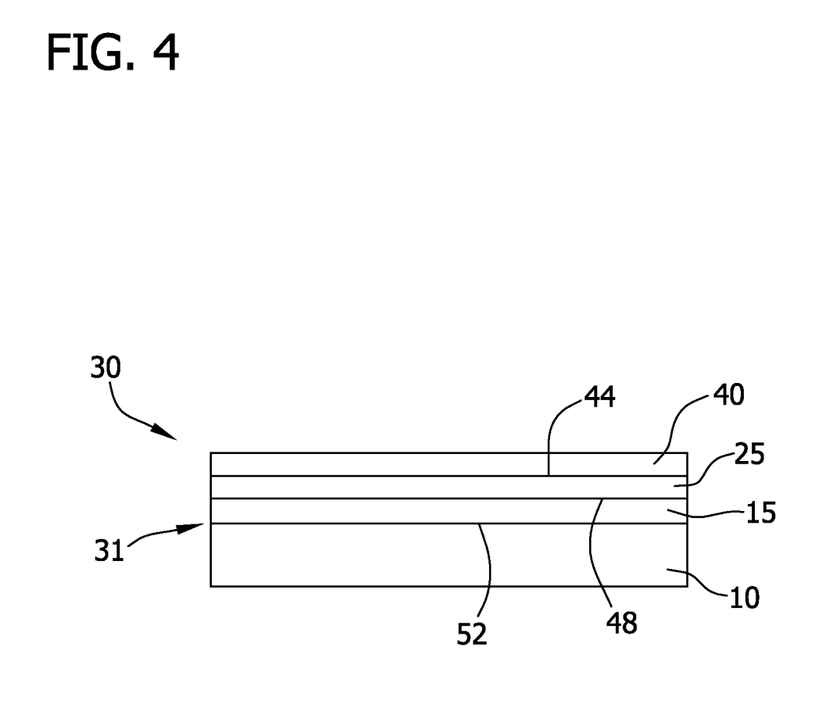
FIG. 4 is a SOI structure with a sacrificial oxide layer disposed thereon.

In a first step $S_1$ of the metal-reducing process and as shown in FIG. 4, a sacrificial oxide layer 40 is formed on the front surface of the silicon device layer 25. The sacrificial oxide layer 40 may be a native oxide layer that forms upon exposing the structure to ambient air. Such native oxide layers may be from about 5 Å to about 15 Å thick. For example, a native oxide layer may be about 10 Å and typically about 8 Å, (i.e., about 0.8 nm thick). Alternatively, the sacrificial oxide layer 40 may be formed by heating the wafer in an oxygen-containing atmosphere. In several embodiments, a small amount of oxygen is added to the atmosphere in which the SOI structure is heated in step $S_2$ described below (i.e., steps $S_1$ and $S_2$ occur in the same apparatus (e.g., furnace) and may occur simultaneously). The thickness of the oxide layer is not critical and any thickness may be suitable. In this regard, the sacrificial oxide layer need not be continuous on the surface of the silicon device layer, however it is preferred that any gaps in sacrificial oxide layer coverage be less than the device layer thickness.

The methods of the present disclosure for reducing the metal content of the SOI structure may be described in relation to several interfaces within the structure. As shown in FIG. 4, the sacrificial silicon oxide layer-containing structure has a first interface 44 formed between the sacrificial oxide layer 40 and the silicon device layer 25. A second interface 48 is formed between the device layer 25 and the dielectric layer 15 (e.g., the silicon oxide layer) and a third interface 52 is formed between the dielectric layer 15 and the handle wafer 10.

After the sacrificial oxide layer 40 is formed, in step $S_2$ of the metal-reducing process, the silicon on insulator structure is heated to a temperature $T_1$. $T_1$ should be chosen to be sufficiently high to allow essentially all metal atoms (e.g., or at least essentially all metal atoms of a particular type such as nickel atoms) in the device layer to dissolve (i.e., to dissociate from metal agglomerates within the device layer). $T_1$ should also not exceed a temperature at which the dissolved metal atoms cross the sacrificial oxide layer-silicon device layer interface 44 and enter the sacrificial oxide layer 40. By maintaining $T_1$ below such temperatures, metal atoms (e.g., nickel) in the device layer 40 become "pinned" when they contact the sacrificial oxide layer-device layer interface 44 or contact the device layer-dielectric layer interface 48. It has been found that at temperatures above the dissolution temperature of metal in the device layer, dissolved metal atoms have a chemical potential at the various device layer-oxide interfaces that is lower than the chemical potential for atoms within the bulk which causes the metal atoms to become "pinned" or "trapped" at the respective interface. However, if the temperature $T_1$ of the structures exceeds a critical value, metal atoms may cross the various oxide interfaces. This may be problematic as metal from the bulk of the SOI wafer may then cross the dielectric layer and enter the silicon device layer. Additionally, metal that has diffused into oxides may dissolve into the oxide but not migrate to the surface which may require hotter, longer processes with lower throughput. Further, temperatures at which metal atoms cross the oxide surface may cause an engineered bulk microdefect density profile (e.g., oxygen precipitates or nuclei thereof) to become altered. Accordingly, it is preferred that $T_1$ is no more than about 25° C. greater than the temperature at which the metal completely dissolves in the device layer 25. In other embodiments $T_1$ is no more than about 20° C. greater, no more than about 15° C. greater, no more than about 10° C. greater or even no more than about 5° C. greater than the temperature at which the metal completely dissolves in the device layer 25.

Figure 5:
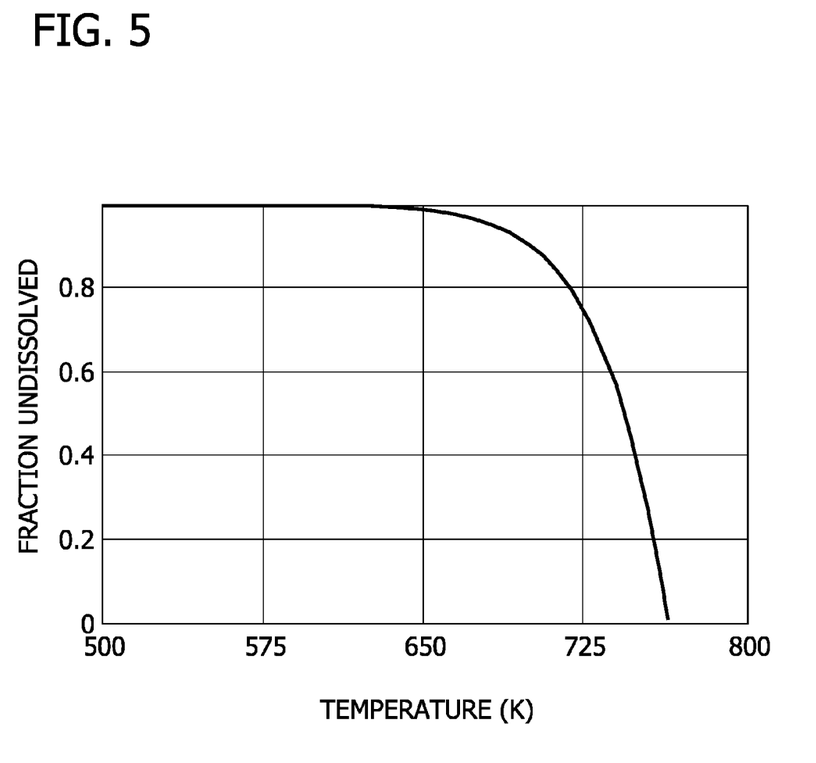
FIG. 5 is a graph depicting the solubility of nickel in silicon as a function of temperature.

As stated above, $T_1$ is chosen such that essentially all of the particular metal which is desired to be removed from the structure dissolves in the silicon layer. $T_1$ may be determined empirically. For example, a solubility function based on experimental data for the particular metal of which it is desired to reduce the concentration thereof may be used to determine $T_1$. In the case of nickel in the silicon device layer, the solubility of nickel and silicon has been reported in INSPEC, EMIS Data Reviews, No. 4, Properties of Silicon, p. 446 (1988) (extrapolated to low temperatures) as $$[Ni]_{Si} = 1.5 \cdot 10^{24} \exp\left(\frac{-1.68 eV}{k_B T}\right) \quad (1)$$

where $[Ni]_{Si}$ is expressed in atoms/cm$^3$, T is in Kelvin and $K_B$ is Boltzmann's constant (8.617×10$^{-5}$ eV/K). This function is shown graphically in FIG. 5. As can be seen from FIG. 5, nickel appears to be completely soluble at temperatures above about 760° K (above about 490° C.). Accordingly, in embodiments of the present disclosure in which it is desired to remove nickel, $T_1$ may be at least about 490° C., at least about 500° C. or at least about 510° C.

The wafer should be held at a temperature $T_1$ sufficient to dissolve essentially all of the particular metal but less than a temperature at which the metal atoms cross the oxide interfaces 44, 48 for a period of time $t_1$ sufficient to allow metal atoms to substantially evenly disperse throughout the device layer. By allowing the metal atoms to evenly disperse, the atoms are less likely to recombine during cooling and form metal precipitates. In this regard, for purposes of the present disclosure, the metal atoms are "evenly dispersed" in the silicon layer when the mean axial diffusion distance of metal atoms (i.e., the average distance at which metal atoms travel toward either the sacrificial oxide layer-silicon device layer interface 44 or the device layer-dielectric layer interface 48) is many times larger the device layer thickness (e.g., at least about 100 times). In some embodiments, the mean axial diffusion distance of metal atoms is at least about 500 times the silicon device layer thickness or at least about 1000 times, at least about 2500 times or even at least about 5000 times the device layer thickness (e.g., from about 500 to about 10,000 times or from about 2500 to about 10,000 times the device layer thickness). The dispersal of metal atoms in the device layer may also be observed by using destructive testing that involves various thermal cycles, precipitation and etching to delineate precipitates.

In this regard, the mean axial diffusion distance of metal atoms may be determined from an experimentally determined diffusivity function and by the following equation which relates diffusivity and soak time to the mean axial diffusion distance, d.

$$d = \sqrt{4Dt} \quad (2).$$

For nickel metal in the silicon device layer, the diffusivity D has been reported in INSPEC, EMIS Data Reviews, No. 4, Properties of Silicon, p. 424 (1988) (extrapolated to low temperatures) as $$D(Ni)_{Si} = 2 \cdot 10^{-3} \exp\left(\frac{-0.47 eV}{k_B T}\right) \quad (3)$$

where $D(Ni)_{Si}$ is expressed in cm$^2$/sec, T is in Kelvin and $K_B$ is Boltzmann's constant (8.617×10$^{-5}$ eV/K). Suitably for nickel atoms in the silicon device layer, at an anneal temperature ranging from 490° C. to about 515° C., anneals of at least about 15 minutes (corresponding to a mean axial diffusion distance of about 0.79 mm at a temperature of about 500° C. which is at least 4000 times the thickness of typical device layers) may be used or even anneals as short as about 10 minutes or more, about 5 minutes or more or even as short as 1 minute or more may be used.

Further in this regard, it should be understood that, for purposes of the present disclosure, $T_1$ need not be a single temperature at which the SOI structure is maintained for a period of time $t_1$. Rather, the wafer may be maintained within a range of temperatures which allows essentially all of the particular metal to be dissolved but is less than a temperature at which the metal atoms cross the oxide interfaces 44, 48 for a time period $t_1$ sufficient to allow metal atoms to substantially evenly disperse throughout the device layer.

After time period $t_1$, the wafer is cooled from $T_1$ to a temperature $T_2$ in step $S_3$, $T_2$ being a temperature at which the metal atoms are substantially immobile in silicon, at an average cooling rate of R. The cooling rate R is sufficiently low to cause substantially no metal precipitation to occur in the silicon device layer during cooling. As the wafer cools, the metal atoms in the device layer seek their lowest chemical potential which has been found to occur at the oxide interfaces 44, 48. If the wafer cools too slow, the metals may instead nucleate and combine into precipitates. Accordingly, the cooling rate R is controlled to be sufficiently fast to cause substantially no metal precipitation to occur in the silicon device layer during cooling. Suitably, the cooling rate of the silicon wafer may be maintained to be at least about 0.3° C./min or, as in other embodiments, at least about 1° C./sec, at least about 5° C./min, at least about 30° C./min, at least about 60° C./min or at least about 100° C./min (e.g., from about 0.3° C./min to about 5000° C./min, from about 0.3° C./min to about 1000° C./min or from about 1° C./min to about 500° C./min).

For purposes of the present disclosure, the temperature at which metal atoms are substantially immobile in silicon is the temperature at which 80% of the metal of interest remains undissolved in silicon. As can be seen from FIG. 5, nickel is substantially immobile in silicon at about 715° K (about 440° C.) (i.e., $T_2$ is about 440° C. or less). In other embodiments, $T_2$ is about 425° C. or less, about 400° C. or less or about 300° C. or less. It should be noted that steps $S_2$ and $S_3$ may be performed in the same ambient and suitable ambients include gases which are inert with respect to silicon and silicon oxide atoms. In some embodiments, the ambient comprises an amount of oxygen to grow a sacrificial oxide layer on the surface of the SOI structure in step $S_1$ as described above.

In addition to controlling the cooling rate such that substantially no metal precipitation occurs in the silicon device layer during cooling, the cooling rate should also be high enough to cause a temperature gradient across the wafer such that the temperature at the sacrificial oxide layer-silicon device layer interface 44 exceeds the temperature at the silicon device layer-dielectric layer interface 48 during cooling. This gradient allows more metal atoms to migrate and be pinned at the sacrificial oxide layer-silicon device layer interface 44 relative to the silicon device layer-dielectric layer interface 48 as metals at the silicon device layer-dielectric layer interface 48 are mobile for an increased amount of time compared to the metals at the sacrificial oxide layer-silicon device layer interface 44. Suitable cooling rates include rates of at least about 0.3° C./sec or even at least about 5° C./sec as described above.

The movement of metal during steps $S_2$ and $S_3$ of the present disclosure is shown schematically in FIG. 6. FIG. 6 schematically shows a SOI wafer 31 with a sacrificial oxide layer 40 on the surface thereof. The temperature profile of the wafer as a function of time is shown within the dielectric layer 15. Before step $S_2$, the device layer 25 includes a number of metal precipitates 53 (e.g., nickel precipitates). Upon heating during step $S_2$, the precipitates dissolve and metal atoms become evenly dispersed throughout the silicon device layer 25. During cooling in step $S_3$, the metal atoms migrate to their lowest chemical potential which is at the oxide interfaces 44, 48, preferably with the greater amount migrating to the interface 44 with the native oxide layer 40 than the interface 48 with the dielectric layer 15. In this regard, steps $S_1$, $S_2$ and $S_3$ result in a SOI structure with a sacrificial oxide layer and a device layer comprising metal atoms of a first type (e.g., nickel atoms), wherein at least about 50% of the metal atoms of the first type are positioned in the device layer at the interface 44 formed between the sacrificial oxide layer 40 and device layer 25. In some embodiments, at least about 55%, at least about 60% or even at least about 70% of the metal atoms of the first type are positioned in the device layer at the interface 44. It should be noted that, as used herein, metal atoms located "at the interface 44" either (i) make contact with both the device layer 25 and sacrificial oxide layer 40 or (ii) are within the device layer 25 at a distance from the interface 44, the distance being sufficiently small such that the atoms are accessible to conventional cleaning processes (i.e., are capable of being removed by such processes) after the sacrificial oxide layer is removed.

The sacrificial oxide layer 40 is removed as well as the metal atoms at the interface 44 therewith in step $S_4$ of the metal-reducing process. The sacrificial oxide layer 40 and metal atoms may be removed by contacting the SOI structure with an etching solution. Any suitable etching solution known to those of skill in the art for semiconductor cleaning may be used including SC1 (a $NH_4OH$ and $H_2O_2$ mixture) and HF cleaning baths. Generally the solutions are applied under conditions suitable to remove the sacrificial oxide layer as may be determined by those of skill in the art. The surface of the SOI structure may be contacted with the etchant by immersing (or at least partially immersing) the SOI structure in an etchant bath or by selectively etching the surface by contacting the surface with an etchant gas (e.g., HF etchant gas). Batch-immersion (cleaning benches) may be used for etching and spin etching techniques may also be used without departing from the scope of the present disclosure.

In some particular embodiments, the solution is an aqueous HF solution that may optionally contain an amount of $H_2O_2$. The concentration of HF in the solution (by weight) may be less than about 50% and, in other embodiments, is less than about 25%, less than about 10%, less than about 5% or less than about 2% (e.g., from about 0.5% to about 50% or from about 0.5% to about 10%). The HF solution may contain one or more other components such as complexing ligands or surfactants; however, in certain embodiments the etchant consists essentially of water and HF. The etchant may also be a gas that is contacted with the surface of the structure. Suitable gases include HF gas that may be diluted in a carrier gas such as hydrogen, argon or nitrogen.

The period of time for which the etchant contacts the silicon layer may vary according to the corrosiveness of the etchant, its concentration and the thickness of the oxide that must be removed before the metal atoms trapped at the device layer-sacrificial oxide interface are exposed and removed. For oxide thicknesses less than about 1 nm, time scales typical for conventionally-used SC1 or HF baths (no more than 18 minutes, and typically less than 5 minutes) may be used. In general, SC1 processing is followed by rinsing and acid treatment (i.e., a SC2 clean) to remove metal deposited on the surface by the SC1 clean, as is conventional in the field of the present disclosure. Processing conditions are well known to those of skill in the art and any number of combinations of chemical baths and process times to remove the surface oxide and the metal atoms pinned immediately underneath may be used without departing from the scope of the present disclosure.

Step $S_4$ of the present disclosure results in removal of metal atoms at the interface 44 which reduces the total metal content of the silicon device layer. For instance, the total metal content of the device layer may be reduced to the solubility limit of the metal of interest in silicon at temperature $T_1$ or even below this solubility limit.

To further reduce the metal content in the silicon device layer, steps $S_1$, $S_2$, $S_3$ and $S_4$ may be repeated for one or more additional cycles such as, for example, about 2 cycles or more, about 3 cycles or more or even about 5 cycles or more.

EXAMPLES

Example 1

Reduction of Metal-Related Defects in SOI Wafers that were Pre-Epitaxial Layer Smooth Annealed (PESA) but not Smoothed by Gas Etching (Epi-Smoothed)

Figure 7:
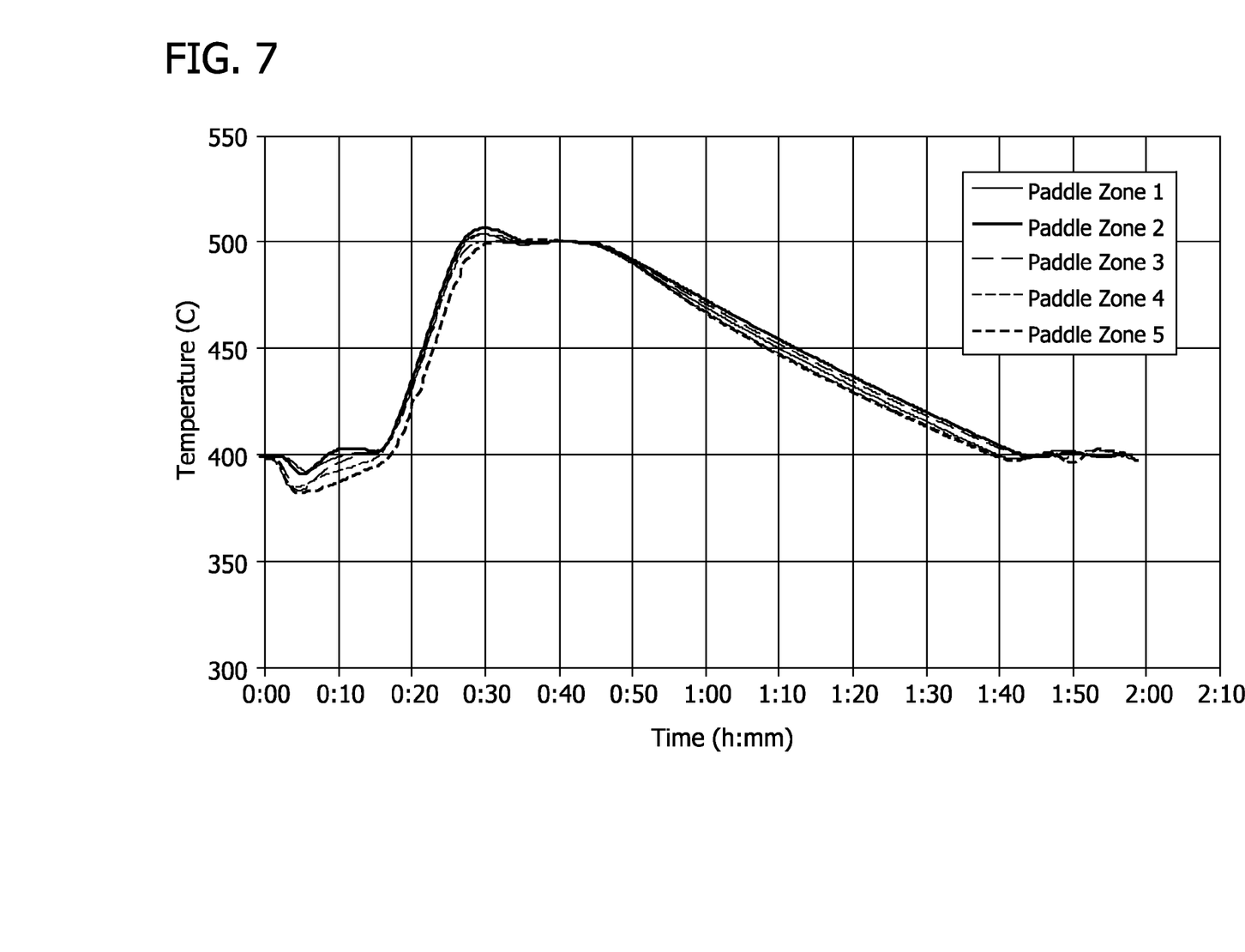
FIG. 7 is a graph showing the temperature profile of the wafer during processing according to Example 1.

Eight SOI wafers with Secco wand haze (i.e., very scattered visible light caused by small nickel precipitates) and which had a native oxide layer at the surface thereof were tested. The SOI wafers had been bonded, cleaved and annealed at 1125° C. (i.e., pre-epitaxial layer smooth annealing (PESA)) but had not been subjected to high-temperature gaseous etching (i.e., epitaxial-smoothing (epi-smoothing)). Four wafers were used as a control and the four remaining wafers were heated to 500° C. in a vertical furnace (A412, ASM (The Netherlands)) for 15 minutes with a small amount of oxygen insufficient to grow appreciable oxide (<3 Å). The temperature profile for the wafers is illustrated in FIG. 7 in which the temperatures for the various paddle zones of the furnace are shown. The ramp down cooling rate was about 1.8° C./min.

Two wafers that were annealed at 500° C. were then etched by use of a HF solution for 8 minutes and the other two were etched by use of a $HF/H_2O_2$ solution for 8 minutes. The concentration of HF was about 0.5 wt % and, when used, the concentration of $H_2O_2$ was about 2.5 wt %. All wafers were then epi-smoothed (E3000 EPI reactor, ASM (The Netherlands)) in a two step etching process in which the wafers were heated to 1100° C. for a set period of time and then cooled to 1000° C. while contacting the wafers with about a 0.7 vol % HCl in hydrogen ambient. Defects were measured by highlighting metal precipitates using a decorative etch. The decorative etch included a standard Secco etch to etch through to any metal precipitates followed by an HF etch to undercut the buried oxide layer in any areas where the Secco etch created a pathway to the BOX layer. The resulting pits were detected by a Kodak bright light. The defects were measured for each wafer in two different quadrants (tests "a" and "b" below).

The results of the test are shown in Table 1 below. Results of the bright light assessment are shown in the "Defects Present?" column. The column titled "Extension" indicates the distance the wand haze extended from the edge of the wafer toward the center. A field of view of the wafer in an area were wand haze was present was selected to count defects. A random field of view was selected for wafers where no defects were observed. The microscope objective was chosen such that the defects could properly be counted. Only one field of view was used per quadrant. The total number of defects measured for each field of view is shown in the "Defect Count" column and the number of defects per $cm^2$ is shown in the "Defect Density" column.

TABLE 1

Defect amounts in SOI wafers heated to 500° C. for 15 minutes and in control wafers processed according to Example 1.

| Wafer | Metal Reduction Treatment | Etch | Defects Present? | Extension (mm) | Objective | Defect Count | Defect Density (defects/cm$^2$) |
|---|---|---|---|---|---|---|---|
| 1a | 500° C., 15 min | HF | None | #N/A | 1-5x | 0 | 0 |
| 1b | 500° C., 15 min | HF | None | #N/A | 1-5x | 0 | 0 |
| 2a | 500° C., 15 min | HF + H$_2$O$_2$ | None | #N/A | 1-5x | 0 | 0 |
| 2b | 500° C., 15 min | HF + H$_2$O$_2$ | None | #N/A | 1-5x | 0 | 0 |
| 3a | 500° C., 15 min | HF | None | #N/A | 1-5x | 0 | 0 |
| 3b | 500° C., 15 min | HF | None | #N/A | 1-5x | 0 | 0 |
| 4a | 500° C., 15 min | HF + H$_2$O$_2$ | None | #N/A | 1-5x | 0 | 0 |
| 4b | 500° C., 15 min | HF + H$_2$O$_2$ | None | #N/A | 1-5x | 0 | 0 |
| 5a | None | HF | Wand Haze | 30 | 2-20x | 7 | 1892 |
| 5b | None | HF | Wand Haze | 42 | 2-20x | 6 | 1622 |
| 6a | None | HF + H$_2$O$_2$ | Wand Haze | 36 | 2-20x | 17 | 4595 |
| 6b | None | HF + H$_2$O$_2$ | Wand Haze | 33 | 2-20x | 3 | 811 |
| 7a | None | HF + H$_2$O$_2$ | Wand Haze | 33 | 2-20x | 6 | 1622 |
| 7b | None | HF + H2O2 | Wand Haze | 30 | 2-20x | 6 | 1622 |
| 8a | None | HF | Wand Haze | 33 | 2-20x | 4 | 1081 |
| 8b | None | HF | Wand Haze | 30 | 2-20x | 2 | 541 |

All defects are believed to be attributable to nickel due to its behavior and the thermal recipe used in the processing recipes. As can be seen from Table 1, the 500° C. heat treatment resulted in no defects being detected.

Example 2

Reduction of Metal-Related Defects in End-of Line SOI Wafers

Four end-of-line SOI wafers (i.e., wafers that were processed as in Example 1 and then processed through a final cleaning and subjected to applicable inspections (particles, flatness and layer thickness inspections)) that had Secco wand haze were heated according to the process of Example 1 (500° C. for 15 minutes with 1.8° C./min ramp down). As these wafers had previously been stripped of the native oxide layer, the sacrificial oxide layer was formed during annealing as a result of the partial pressure of oxygen present during heating. Each wafer was selected from a lot of wafers that were graded into one of four defect categories depending on the extent to which one wafer in the lot contained Secco wand haze. A second wafer from each lot was also used as a control (4 control wafers). After the 500° C. heat treatment, the heat-treated wafers were combined with the control wafers and all wafers received a HF clean, a final clean (SC1 and SC2 clean) and a final inspection on a particle inspection tool (SP207, KLA-Tencor (Milpitas, Calif.)). All eight wafers were then subjected to Secco testing in accordance with the process set forth in Example 1 with the results being shown in Table 2. The wafer tested in lot 3 had two "hot spots" near the wafer edge.

TABLE 2

Defect amounts in SOI wafers heated to 500° C. for 15 minutes and in control wafers processed according to Example 2.

| Wafer Lot | Metal Reduction Treatment | Etch | Defect Grading | Quadrant Tested | Defect Class | Extension (mm) | Objective | Defect Count | Density (defects/cm$^2$) |
|---|---|---|---|---|---|---|---|---|---|
| 1a | None | HF | Edge Band | 1 | None | N/A | 1-5x | 0 | 0 |
| 1b | None | HF | Edge Band | 4 | None | N/A | 1-5x | 0 | 0 |
| 2a | None | HF | Light Wand Haze | 1 | Wand Haze | 30 | 1-5x | 147 | 2450 |
| 2b | None | HF | Light Wand Haze | 4 | Wand Haze | 30 | 1-5x | 16 | 267 |
| 2c | None | HF | Light Wand Haze | 4 | Hot Spot | 4 | 1-5x | 246 | 4100 |
| 3a | None | HF | Heavy Wand Haze, small extension | 1 | Wand Haze | 3 | 1-5x | 189 | 3150 |
| 3b | None | HF | Heavy Wand Haze, small extension | 4 | Wand Haze | 3 | 1-5x | 677 | 11284 |
| 3c | None | HF | Heavy Wand Haze, small extension | 4 | Hot Spot | 3 | 1-5x | 143 | 2383 |
| 3d | None | HF | Heavy Wand Haze, small extension | 4 | Hot Spot | 3 | 2-20x | 36 | 9731 |
| 4a | None | HF | Heavy Wand Haze | 1 | Wand Haze | 4 | 1-5x | 297 | 4950 |

TABLE 2-continued

Defect amounts in SOI wafers heated to 500° C. for 15 minutes and in control wafers processed according to Example 2.

| Wafer Lot | Metal Reduction Treatment | Etch | Defect Grading | Quadrant Tested | Defect Class | Extension (mm) | Objective | Defect Count | Density (defects/cm$^2$) |
|---|---|---|---|---|---|---|---|---|---|
| 4b | None | HF | Heavy Wand Haze | 4 | Wand Haze | 33 | 1-5x | 313 | 5217 |
| 4c | None | HF | Heavy Wand Haze | 4 | Hot Spot | 4 | 1-5x | 306 | 5100 |
| 5a | 500° C., 15 min | HF | Edge Band | 1 | None | N/A | 1-5x | 0 | 0 |
| 5b | 500° C., 15 min | HF | Edge Band | 4 | None | N/A | 1-5x | 0 | 0 |
| 6a | 500° C., 15 min | HF | Light Wand Haze | 1 | None | N/A | 1-5x | 0 | 0 |
| 6b | 500° C., 15 min | HF | Light Wand Haze | 4 | None | N/A | 1-5x | 0 | 0 |
| 7a | 500° C., 15 min | HF | Heavy Wand Haze, small extension | 1 | None | N/A | 1-5x | 0 | 0 |
| 7b | 500° C., 15 min | HF | Heavy Wand Haze, small extension | 4 | None | N/A | 1-5x | 0 | 0 |
| 8a | 500° C., 15 min | HF | Heavy Wand Haze | 1 | None | N/A | 1-5x | 0 | 0 |
| 8b | 500° C., 15 min | HF | Heavy Wand Haze | 4 | None | N/A | 1-5x | 0 | 0 |

As can be seen from Table 2, the 500° C. heat treatment resulted in no defects being detected.

Example 3

Comparison of Defect Density Before and After 500° C. Heat Treatment

Sixteen wafers from sixteen different lots of wafers that were previously stripped of oxide were subjected to pre-epitaxial layer smooth annealing but were not subjected to epi-smoothing. The wafers were subjected to the 500° C. heat treatment of Example 1, were stripped of oxide and subjected to epi-smoothing and other end-of-line processing (e.g., a final cleaning and subjected to applicable inspections). The wafers were then analyzed for defects. Several wafers in the same lot were also analyzed (pre-epi smoothing) for defects before the 500° C. heat treatment for comparison purposes.

TABLE 3

Defect amounts in SOI wafers before and after 500° C. heat treatment processed according to Example 3.

| | Before 500° C. Heat Treatment | | | | After 500° C. Heat Treatment | | | |
|---|---|---|---|---|---|---|---|---|
| Wafer Lot | Extension (mm) | Objective | Defect Count | Defect Density (defects/cm$^2$) | Extension (mm) | Objective | Defect Count | Defect Density (defects/cm$^2$) |
| 1a | 27 | 1-5x | 6 | 100 | NA | 1-5x | 0 | 0 |
| 1b | 24 | 2-20x | 3 | 811 | NA | 1-5x | 0 | 0 |
| 2a | 39 | 2-20x | 96 | 25949 | 3 | 2-20x | 41 | 11082 |
| 2b | 42 | 2-20x | 103 | 27841 | 6 | 2-20x | 98 | 26490 |
| 3a | | | | | NA | 1-5x | 0 | 0 |
| 3b | | | | | NA | 1-5x | 0 | 0 |
| 4a | | | | | 4 | 1-5x | 375 | 6250 |
| 4b | | | | | 9 | 1-5x | 769 | 12818 |
| 5a | 30 | 2-20x | 4 | 1081 | NA | 1-5x | 0 | 0 |
| 5b | 36 | 2-20x | 2 | 541 | NA | 1-5x | 0 | 0 |
| 6a | 27 | 2-20x | 5 | 1352 | NA | 1-5x | 0 | 0 |
| 6b | 33 | 2-20x | 3 | 811 | NA | 1-5x | 0 | 0 |
| 7a | 39 | 2-20x | 60 | 16218 | 2 | 1-5x | 18 | 300 |
| 7b | 27 | 2-20x | 74 | 20002 | 2 | 1-5x | 19 | 317 |
| 8a | 27 | 2-20x | 28 | 7569 | 3 | 1-5x | 13 | 217 |
| 8b | 30 | 2-20x | 91 | 24598 | 4 | 1-5x | 317 | 5284 |
| 9a | 24 | 2-20x | 91 | 24598 | 60 | 1-5x | 2404 | 40069 |
| 9b | 24 | 2-20x | 159 | 42978 | 2 | 1-5x | 23 | 383 |
| 10a | 30 | 2-20x | 12 | 3244 | NA | 1-5x | 0 | 0 |
| 10b | 33 | 2-20x | 42 | 11353 | NA | 1-5x | 0 | 0 |
| 11a | 24 | 2-20x | 2 | 541 | NA | 1-5x | 0 | 0 |
| 11b | 21 | 2-20x | 7 | 1892 | NA | 1-5x | 0 | 0 |
| 12a | 18 | 2-20x | 2 | 541 | NA | 1-5x | 0 | 0 |
| 12b | 12 | 1-5x | 5 | 83 | NA | 1-5x | 0 | 0 |
| 13a | | | | | NA | 1-5x | 0 | 0 |
| 13b | | | | | 9 | 2-20x | 50 | 13515 |
| 14a | | | | | NA | 1-5x | 0 | 0 |
| 14b | | | | | 3 | 2-20x | 8 | 2162 |
| 15a | | | | | NA | 1-5x | 0 | 0 |
| 15b | | | | | 8 | 2-20x | 13 | 3514 |
| 16a | | | | | 9 | 2-20x | 77 | 20813 |
| 16b | | | | | 15 | 2-20x | 272 | 73523 |

As can be seen from Table 3, the 500° C. heat treatment resulted in significant reduction of nickel-related defects.

Example 4

Analysis of Multi-Cycle Metal Reduction Processes

Four SOI wafers were selected from four lots and subjected to a 500° C., 15 minute heat treatment followed by removal of the sacrificial oxide layer as in Example 1. The heat treatment and oxide removal were then repeated in a second cycle. Defects densities were determined before the first heat treatment, after the first heat treatment and after the second heat treatment. Defect densities are shown in Table 4 below.

TABLE 4

Defect amounts in SOI wafers before and after a 500° C. heat treatment and after a second 500° C. heat treatment.

| | Before 500° C. Heat Treatments | | | | After First 500° C. Heat Treatment | | | | After Second 500° C. Heat Treatment | | | |
|---|---|---|---|---|---|---|---|---|---|---|---|---|
| Wafers | Extension (mm) | Objective | Defect Count | Defect Density (defects/cm$^2$) | Extension (mm) | Objective | Defect Count | Defect Density (defects/cm$^2$) | Extension (mm) | Objective | Defect Count | Defect Density (defects/cm$^2$) |
| 1a | 39 | 2-20x | 96 | 25949 | 3 | 2-20x | 41 | 11082 | 5 | 2-20x | 223 | 60278 |
| 1b | 42 | 2-20x | 103 | 27841 | 6 | 2-20x | 98 | 26490 | #N/A | 1-5x | 0 | 0 |
| 2a | | | | | 4 | 1-5x | 375 | 6250 | #N/A | 1-5x | 0 | 0 |
| 2b | | | | | 9 | 1-5x | 769 | 12818 | 6 | 2-20x | 58 | 15678 |
| 3a | 27 | 2-20x | 28 | 7569 | 3 | 1-5x | 13 | 217 | 7 | 1-5x | 10 | 167 |
| 3b | 30 | 2-20x | 91 | 24598 | 4 | 1-5x | 317 | 5284 | #N/A | 1-5x | 0 | 0 |
| 4a | | | | | 9 | 2-20x | 77 | 20813 | 4 | 1-5x | 88 | 1467 |
| 4b | | | | | 15 | 2-20x | 272 | 73523 | 6 | 1-5x | 112 | 1867 |

As can be seen from Table 4, the second outdiffusion results in further reduction of defects for several wafers.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A method of reducing the metal content of a silicon on insulator structure comprising:

forming a sacrificial oxide layer on a front surface of a silicon device layer of a silicon on insulator structure, the silicon on insulator structure comprising a handle wafer, the silicon device layer and a dielectric layer between the handle wafer and the silicon layer, the dielectric layer and silicon device layer forming an interface between the dielectric layer and silicon device layer, the sacrificial oxide layer and the silicon device layer forming an interface between the sacrificial oxide layer and the silicon device layer;

heating the silicon on insulator structure having a sacrificial oxide layer thereon to a temperature $T_1$ sufficient to dissolve all metal precipitates present in the device layer for a time $t_1$ sufficient to allow metal atoms to evenly disperse throughout the device layer, wherein the dissolved metal atoms have a chemical potential at the sacrificial oxide layer-silicon device layer interface lower than the chemical potential for the atoms within the bulk of the device layer such that the atoms become pinned at the sacrificial oxide layer-silicon device layer interface and the silicon device layer-dielectric layer interface;

cooling the silicon on insulator structure from $T_1$ to a temperature $T_2$ at which the metal atoms are substantially immobile in silicon at an average cooling rate R the cooling rate being sufficiently high enough to cause substantially no metal precipitation to occur in the silicon device layer during cooling, the metal atoms migrating to their lowest chemical potential at the sacrificial oxide layer-silicon device layer interface and the silicon device layer-dielectric layer interface; and removing the sacrificial oxide layer and a portion of the metal atoms at the sacrificial oxide layer-silicon device layer interface from the silicon-in-insulator structure.

2. The method as set forth in claim 1 wherein the silicon on insulator structure is heated for a time sufficient to allow the average lateral diffusion distance of the metal atoms to exceed the thickness of the device layer.

3. The method as set forth in claim 2 wherein the silicon on insulator structure is heated for a time sufficient to allow the lateral diffusion distance of the metal atoms to exceed the thickness of the device layer by about 100 times or more.

4. The method as set forth in claim 2 wherein the silicon on insulator structure is heated for a time sufficient to allow the lateral diffusion distance of the metal atoms to exceed the thickness of the device layer by about 1000 times or more.

5. The method as set forth in claim 1 wherein the temperature at the sacrificial oxide layer-silicon device layer interface exceeds the temperature at the silicon device layer-dielectric layer interface during cooling such that more metal atoms are positioned at the sacrificial oxide layer-silicon device layer interface than the silicon device layer-dielectric layer interface.

6. The method as set forth in claim 1 wherein the metal is selected from the group consisting of nickel, copper and cobalt.

7. The method as set forth in claim 1 wherein the metal is nickel.

8. The method as set forth in claim 7 wherein $T_1$ is about 490° C. or more.

9. The method as set forth in claim 1 wherein $T_1$ is at least the temperature at which the metal dissolves in the device layer and is no more than about 25° C. greater than the temperature at which the metal completely dissolves in the device layer.

10. The method as set forth in claim 7 wherein the time $t_1$ at which the silicon on insulator structure is heated is about 1 minute or more.

11. The method as set forth in claim 7 wherein the cooling rate R is about 0.3° C./min or more.

12. The method as set forth in claim 7 wherein $T_2$ is about 440° C.

13. The method as set forth in claim 7 wherein $T_2$ is about 440° C. or less.

14. The method as set forth in claim 1 wherein the sacrificial oxide layer is formed by exposing the structure to ambient air to form a native oxide layer.

15. The method as set forth in claim 1 wherein the sacrificial oxide layer is formed by heating the wafer in an oxygen-containing atmosphere.

16. The method as set forth in claim 1 wherein the silicon device layer is less than about 200 nm thick.

17. The method as set forth in claim 1 wherein the silicon device layer is less than about 75 nm thick.

18. The method as set forth in claim 1 wherein the initial concentration of nickel in the silicon on insulator structure is about $1\times10^{10}$ atoms/cm$^3$ or more.

19. The method as set forth in claim 1 wherein the initial concentration of nickel in the silicon device layer is about $1\times10^{10}$ atoms/cm$^3$ or more.

20. The method as set forth in claim 1 wherein the sacrificial oxide layer forming step, heating step, cooling step and sacrificial oxide layer removal step are repeated for about 2 cycles or more to further reduce the amount of metal in the silicon device layer.

21. The method as set forth in claim 1 wherein the dielectric layer is composed of $SiO_2$.

22. The method as set forth in claim 1 wherein the silicon device layer comprises metal of a first type in an amount at or below the solubility limit of the metal in silicon at temperature $T_1$ after the sacrificial oxide layer is removed.

23. The method as set forth in claim 1 wherein the sacrificial oxide layer and a portion of the metal atoms at the sacrificial oxide layer-silicon device layer interface are removed by contacting the silicon on insulator structure with the sacrificial layer thereon is contacted with an etching solution.

* * * * *